(12) United States Patent
Yoo et al.

(10) Patent No.: US 11,930,647 B2
(45) Date of Patent: Mar. 12, 2024

(54) ELECTRONIC DEVICE AND METHOD FOR MANUFACTURING ELECTRONIC DEVICE

(71) Applicant: SK hynix Inc., Icheon (KR)

(72) Inventors: Si Jung Yoo, Seoul (KR); Tae Hoon Kim, Seongnam (KR); Hyung Dong Lee, Suwon (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 17/878,678

(22) Filed: Aug. 1, 2022

(65) Prior Publication Data

US 2022/0367567 A1    Nov. 17, 2022

Related U.S. Application Data

(63) Continuation of application No. 16/860,686, filed on Apr. 28, 2020, now Pat. No. 11,437,437.

(30) Foreign Application Priority Data

Sep. 3, 2019   (KR) .................. 10-2019-0109131

(51) Int. Cl.
*H10B 63/00* (2023.01)
*H10B 61/00* (2023.01)
*H10N 50/01* (2023.01)
*H10N 50/80* (2023.01)
*H10N 70/00* (2023.01)

(52) U.S. Cl.
CPC .......... *H10B 63/845* (2023.02); *H10B 61/00* (2023.02); *H10N 50/01* (2023.02); *H10N 50/80* (2023.02); *H10N 70/066* (2023.02); *H10N 70/841* (2023.02)

(58) Field of Classification Search
CPC .... H10B 63/845; H10N 50/80; H10N 70/841; H10N 70/231; H10N 70/011
See application file for complete search history.

(56) References Cited

U.S. PATENT DOCUMENTS

| 8,461,000 | B2 | 6/2013 | Alsmeier et al. |
| 9,728,546 | B2 | 8/2017 | Serov et al. |
| 10,381,559 | B1 * | 8/2019 | Zhou .................. H10N 70/882 |
| 2004/0057180 | A1 | 3/2004 | Pashmakov |
| 2014/0217349 | A1 | 8/2014 | Hopkins |

(Continued)

FOREIGN PATENT DOCUMENTS

| CN | 103066075 A | 4/2013 |
| CN | 106449691 A | 2/2017 |

(Continued)

OTHER PUBLICATIONS

Notification of the First Office Action for Chinese Patent Application No. 202010572692.2, dated Dec. 29, 2023.

*Primary Examiner* — Shih Tsun A Chou

(57) ABSTRACT

An electronic device includes a semiconductor memory including material layers each including one or more low-resistance areas and one or more high-resistance areas, insulating layers stacked alternately with the material layers and including protrusions extending more than the material layers, conductive pillars passing through the insulating layers and the low-resistance areas, conductive layers located between the protrusions, and variable resistance layers interposed between the low-resistance areas and the conductive layers.

9 Claims, 13 Drawing Sheets

(56) References Cited

U.S. PATENT DOCUMENTS

2014/0247647 A1   9/2014   Song et al.
2015/0001460 A1   1/2015   Kim et al.
2017/0244030 A1   8/2017   Park et al.

FOREIGN PATENT DOCUMENTS

CN      106611767 A      5/2017
WO      2019/118931 A1   6/2019

\* cited by examiner

ELECTRONIC DEVICE AND METHOD FOR MANUFACTURING ELECTRONIC DEVICE

CROSS-REFERENCE TO RELATED APPLICATION

The present application is a continuation of U.S. patent application Ser. No. 16/860,686 filed Apr. 28, 2020, and claims priority under 35 U.S.C. § 119(a) to Korean patent application number 10-2019-0109131, filed on Sep. 3, 2019, which is incorporated herein by reference in its entirety.

BACKGROUND

Field of Invention

Various embodiments of the present disclosure relate generally to an electronic device, and more particularly, to an electronic device including a semiconductor memory and a method of manufacturing the electronic device.

Description of Related Art

Recently, with requirements of miniaturization, low power consumption, high performance, and diversification of electronic devices, semiconductor devices configured to store information are required in various types of electronic devices such as computers and portable communication apparatuses. Therefore, there has been research on semiconductor devices configured to store data using characteristics of switching between different resistance states depending on a voltage or current being applied. Examples of such semiconductor devices include a resistive random access memory (RRAM), a phase-change random access memory (PRAM), a ferroelectric random access memory (FRAM), a magnetic random access memory (MRAM), an E-fuse, and so forth.

SUMMARY

Various embodiments are directed to an electronic device capable of improving operating characteristics and reliability of memory cells and a method of manufacturing the electronic device.

According to an embodiment, an electronic device may include a semiconductor memory including material layers each including one or more low-resistance areas and one or more high-resistance areas, insulating layers stacked alternately with the material layers and including protrusions extending more than the material layers, conductive pillars passing through the insulating layers and the low-resistance areas, conductive layers located between the protrusions, and variable resistance layers interposed between the low-resistance areas and the conductive layers.

According to an embodiment, a method of manufacturing an electronic device including a semiconductor memory may include forming a stacked structure including sacrificial layers and insulating layers stacked alternately with each other, forming conductive pillars passing through the stacked structure, forming a slit passing through the stacked structure, forming openings by partially removing the sacrificial layers through the slit, forming variable resistance layers in the openings, forming conductive layers in the openings, and forming material layers including low-resistance areas by locally applying an electric field to the sacrificial layers.

According to an embodiment, an electronic device may include a semiconductor memory including a conductive layer extending in a first direction; a conductive pillar extending in a second direction crossing the first direction; a material layer extending in the first direction, the material layer including a first low-resistance area, a second low-resistance area, and a high-resistance area, the first low-resistance area being disposed adjacent to the second low-resistance area in the first direction, the high-resistance area being disposed between the first low-resistance area and the second low-resistance area, the conductive pillar being coupled to the first low-resistance area; and a memory cell disposed at an intersection between the conductive layer and the conductive pillar, and including the first low-resistance area.

BRIEF DESCRIPTION OF THE DRAWINGS

FIGS. 4A to 8A and FIGS. 4B to 8B are views illustrating a method of manufacturing an electronic device according to an embodiment of the present disclosure;

DETAILED DESCRIPTION

Specific structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification.

Hereinafter, embodiments of the present disclosure will be described in detail with reference to the accompanying drawings in order for those skilled in the art to be able to readily implement the technical spirit of the present disclosure.

Figure 1A:
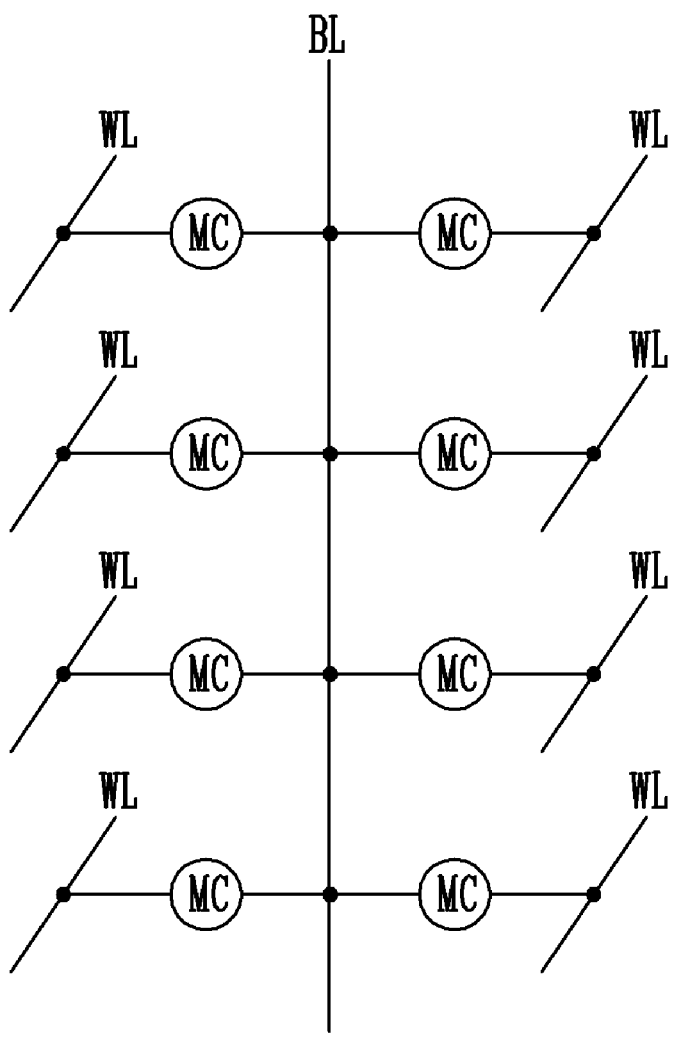
FIGS. 1A and 1B are diagrams each illustrating the structure of an electronic device according to an embodiment of the present disclosure.
Figure 1B:
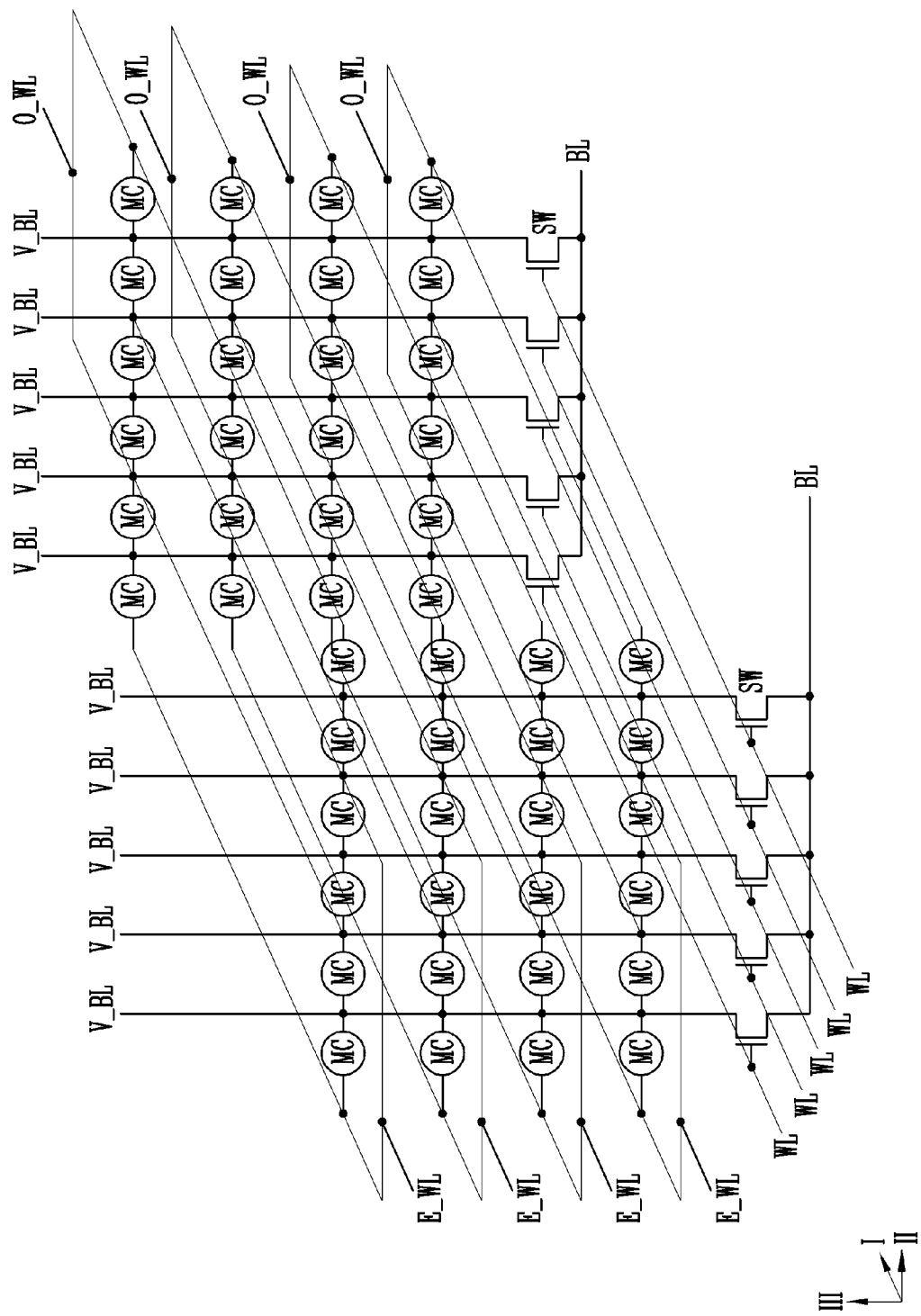

FIGS. 1A and 1B each illustrate a memory cell array of an electronic device according to an embodiment of the present disclosure.

Referring to FIG. 1A, an electronic device according to an embodiment may include a semiconductor memory that includes word lines WL and bit lines BL crossing the word lines WL. The word lines WL and the bit lines BL may be relative to each other. For example, the word lines WL may be bit lines and the bit lines BL may be word lines.

The semiconductor memory may include memory cells MC coupled between the word lines WL and the bit lines BL. The plurality of memory cells MC may share one bit line BL. The memory cells MC sharing one bit line BL may be coupled to different word lines WL.

Referring to FIG. 1B, the semiconductor memory may include odd word lines O_WL, even word lines E_WL, vertical bit lines V_BL, and the memory cells MC. The odd word lines O_WL and the even word lines E_WL each may extend in a first direction I.

The vertical bit lines V_BL each may extend in a third direction III. The memory cells MC coupled between the vertical bit lines V_BL and the odd word lines O_WL may be referred to as odd memory cells and the memory cells MC coupled between the vertical bit lines V_BL and the even word lines E_WL may be referred to as even memory cells. An even memory cell and an odd memory cell which are located at the same level in the third direction III and are adjacent to each other in a second direction II may share the same vertical bit line V_BL. Even memory cells which are located at the same level in the third direction III and are adjacent to each other in the first direction I may share the even word line E_WL. Odd memory cells which are located at the same level in the third direction III and are adjacent to each other in the first direction I may share the odd word line O_WL. The second direction II may cross the first direction I. The third direction III may cross the first direction I and the second direction II and be orthogonal to the plane defined by the first direction I and the second direction II.

The semiconductor memory may further include switches SW for selecting the vertical bit lines BL. The connections between the vertical bit lines V_BL and the bit lines BL may be controlled using the switches SW. Each of the switches SW may include a transistor, a vertical transistor, a diode, or the like. In addition, the semiconductor memory may include the word lines WL for selectively driving the switches SW.

The switches SW may be selected using the word lines WL and the bit lines BL. For example, one word line WL may be selected from the plurality of word lines WL and one bit line BL may be selected from the plurality of bit lines BL, so that one switch SW may be selected from the plurality of switches SW.

The vertical bit lines V_BL may be selected using the switches SW. By turning on the selected switch SW, the bit line BL and the vertical bit line BL may be coupled to each other. As a result, one vertical bit line V_BL may be selected from the plurality of vertical bit lines V_BL. In addition, one odd word line O_WL may be selected from the odd word lines O_WL or one even word line E_WL may be selected from the even word lines E_WL. As a result, one memory cell MC coupled between the selected vertical bit line V_BL and the selected word line O_WL or E_WL may be selected.

Figure 2:
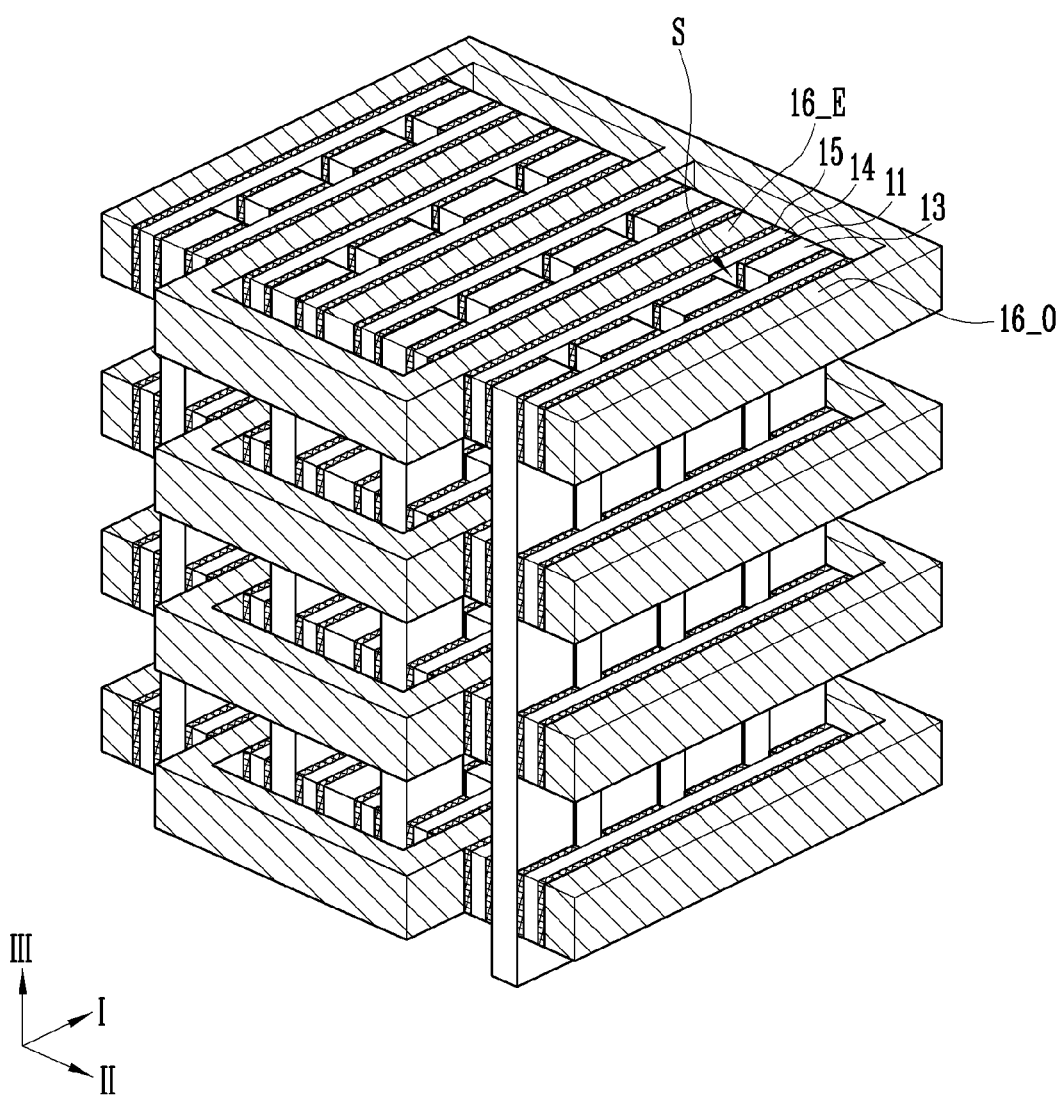
FIG. 2 is a perspective view illustrating the structure of an electronic device according to an embodiment of the present disclosure.

FIG. 2 is a perspective view illustrating the structure of an electronic device according to an embodiment of the present disclosure.

Referring to FIG. 2, an electronic device according to an embodiment may include a semiconductor memory that includes odd word lines 16_O, even word lines 16_E, and vertical bit lines 13.

The odd word lines 16_O may include line patterns each extending in the first direction I and ends of the line patterns may be coupled to each other. The odd word lines 16_O may be stacked in the third direction III and an insulating material may fill between the stacked odd word lines 16_O.

The even word lines 16_E may include line patterns each extending in the first direction I and ends of the line patterns may be coupled to each other. The even word lines 16_E may be stacked in the third direction III and an insulating material may fill between the stacked even word lines 16_E. The line patterns of the odd word lines 16_O and the line patterns of the even word lines 16_E may be arranged alternately in the second direction II.

The vertical bit lines 13 may each extend in the third direction III. The vertical bit lines 13 may be arranged in the first direction I and the second direction II. The vertical bit lines 13 may be located between the even word line 16_E and the odd word line 16_O adjacent to each other in the second direction II. For example, the vertical bit lines 13 may be disposed between a first line pattern of the even word line 16_E and a second line pattern of the odd word line 16_O. Each of the first line pattern and the second line pattern extends in the first direction I, and the first line pattern is disposed adjacent to the second line pattern in the second direction II. An insulating material may fill a space S between the vertical bit lines 13 which are adjacent to each other in the first direction I. The insulating material may include amorphous carbon, a silicon nitride, a transition metal oxide, or a combination thereof.

Memory cells may be located at intersections between the vertical bit lines 13 and the word lines 16_E and 16_O. The memory cells may be stacked in the third direction III along the vertical bit lines 13. Memory cells which are adjacent to each other in the second direction II and are coupled to different word lines 16_E and 16_O may share the vertical bit line 13.

Each of the memory cells may include a portion of a first electrode layer 11, a portion of a variable resistance layer 14, and a portion of a second electrode layer 15. The first electrode layer 11, the variable resistance layer 14, and the second electrode layer 15 may be interposed between the vertical bit line 13 and the word line 16_E or 16_O which are adjacent to each other in the second direction II. The variable resistance layer 14 may extend in the first direction I. Memory cells which are located at the same level in the third direction III and are adjacent to each other in the first direction I may share the variable resistance layer 14. The second electrode layer 15 may be interposed between the variable resistance layer 14 and the word line 16_E or 16_O and extend in the first direction I. Memory cells which are located at the same level in the third direction III and are adjacent to each other in the first direction I may share the second electrode layer 15. The first electrode layer 11 may be interposed between the variable resistance layer 14 and the vertical bit line 13. The first electrode layers 11 of the memory cells which are located at the same level in the third direction III and are adjacent to each other in the first direction I may be insulated from each other.

Figure 3A:
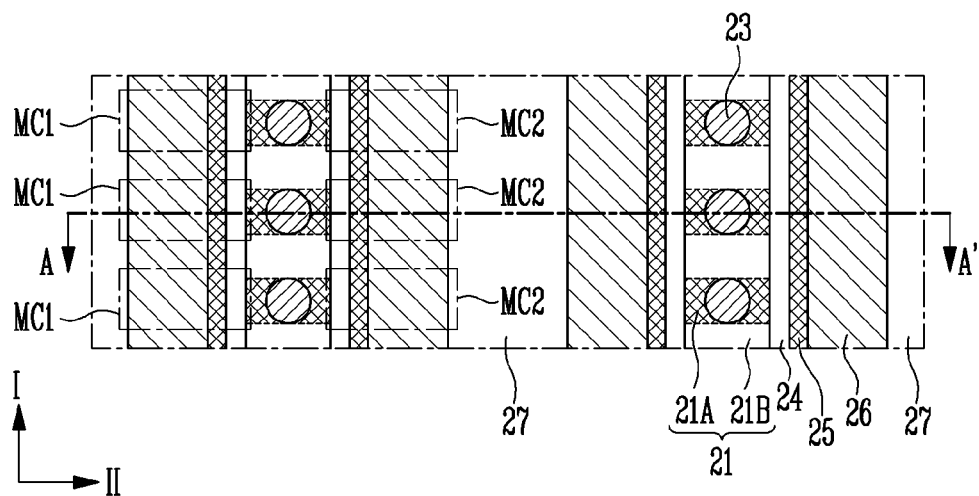
FIGS. 3A and 3B are views illustrating the structure of a semiconductor device according to an embodiment of the present disclosure.
Figure 3B:
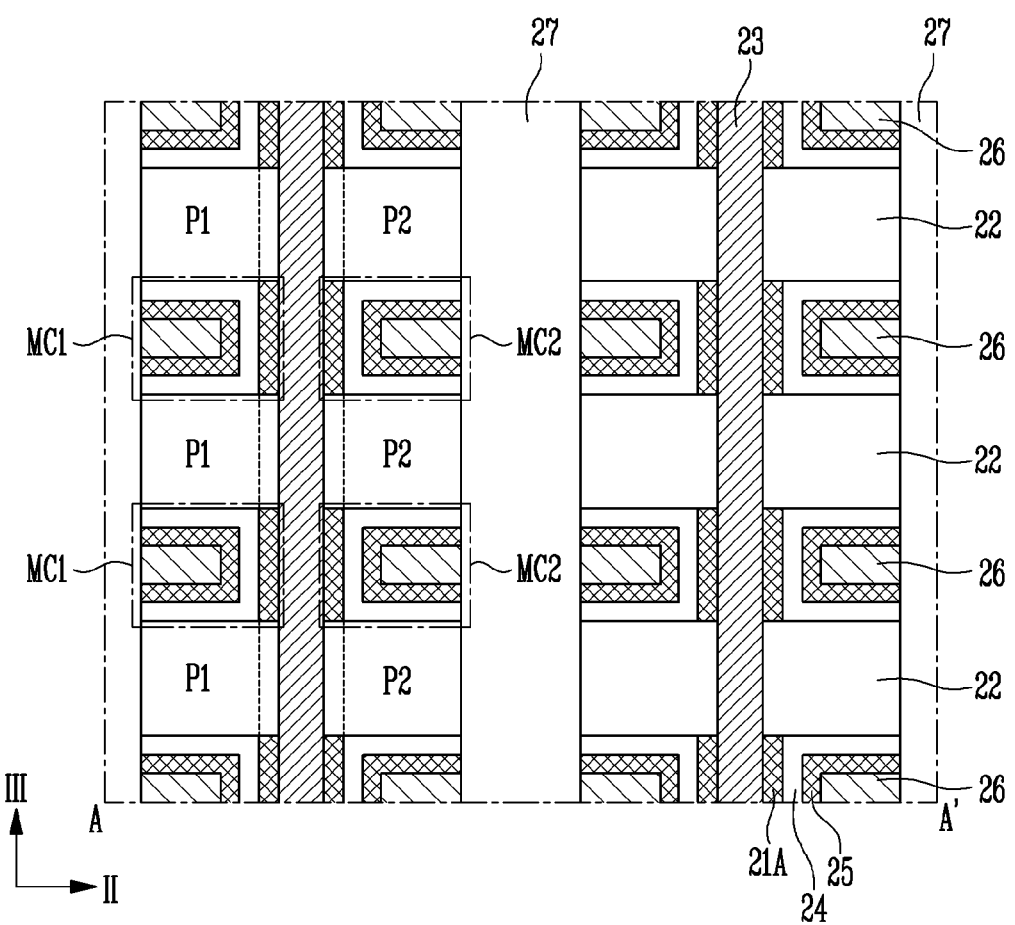

FIGS. 3A and 3B are views each illustrating the structure of a semiconductor device according to an embodiment of the present disclosure. FIG. 3A is a plan view and FIG. 3B is a cross-sectional view along a line A-A' in the second direction II of FIG. 3A.

Referring to FIGS. 3A and 3B, a semiconductor device according to an embodiment may include material layers 21, insulating layers 22, conductive pillars 23, variable resistance layers 24, and conductive layers 26. In addition, the semiconductor device may further include electrode layers 25 and slit insulating layers 27.

The material layers 21 may be stacked in the third direction III. Each of the material layers 21 may be a single layer including one or more low-resistance areas 21A and one or more high-resistance areas 21B. Each of the material layers 21 may include the low-resistance areas 21A and the high-resistance areas 21B that are arranged alternately in the first direction I. The high-resistance areas 21B may be disposed between an adjacent pair of the low-resistance areas 21A. The material layers 21 may include amorphous carbon, a silicon nitride, a transition metal oxide, or a combination thereof.

The conductive pillars 23 may each extend in the third direction III and pass through the insulating layers 22 and the low-resistance areas 21A. The conductive pillars 23 may be arranged in the first direction I. The conductive pillars 23 may be located at positions corresponding to the low-resistance areas 21A, respectively. The conductive pillars 23 may be vertical bit lines.

The insulating layers 22 may be stacked in the third direction III. The insulating layers 22 and the material layers 21 may be stacked alternately with each other. The insulating layers 22 may include an insulating material such as oxides and nitrides. The insulating layers 22 may include protrusions P1 and P2 extending more than the material layers 21 in the second direction II. More specifically, each of the insulating layers 22 may include a first protrusion P1 protruding from one side of each of the material layers 21 and a second protrusion P2 protruding from the other side of each of the material layers 21 when seen in the plan view of FIG. 3A. In addition, each of the first protrusion P1 and the second protrusion P2 may be disposed between adjacent variable resistance layers 24 in the third direction III.

The conductive layers 26 may be located between neighboring protrusions P1 and P2 in the third direction III. The conductive layers 26 may be word lines, for example, odd word lines or even word lines.

The variable resistance layers 24 may be interposed between the low-resistance areas 21A and the conductive layers 26. The variable resistance layers 24 may be interposed between the material layers 21 and the conductive layers 26 and extend in the first direction I. Each of the variable resistance layers 24 may extend between the conductive layers 26 and the insulating layers 22. Each of the variable resistance layers 24 may have a C-shaped cross-section.

The variable resistance layers 24 may reversibly transition between different resistance states according to a voltage or current being applied. When the variable resistance layer 24 includes a resistance material, the variable resistance layer 24 may include a transition metal oxide, or a metal oxide such as a perovskite-based material. Therefore, data may be stored as an electrical path is generated or disappears in the variable resistance layer 24.

When the variable resistance layer 24 has an MTJ structure, the variable resistance layer 24 may include a magnetization fixed layer, a magnetization free layer, and a tunnel barrier layer interposed therebetween. For example, the magnetization fixed layer and the magnetization free layer may include a magnetic material, and the tunnel barrier layer may include an oxide such as magnesium (Mg), aluminum (Al), zinc (Zn), or titanium (Ti). A magnetization direction of the magnetization free layer may be changed by spin torque of electrons in applied current. Therefore, data may be stored depending on changes in the magnetization direction of the magnetization free layer with respect to the magnetization direction of the magnetization fixed layer.

The variable resistance layer 24 may include a phase change material and a chalcogenide-based material. The variable resistance layer 24 may include silicon (Si), germanium (Ge), antimony (Sb), tellurium (Te), bismuth (Bi), indium (In), tin (Sn), selenium (Se), or a combination thereof. For example, the variable resistance layer 24 may be Ge—Sb—Te (GST), for example, $Ge_2Sb_2Te_5$, $Ge_2Sb_2Te_7$, $Ge_1Sb_2Te_4$, $Ge_1Sb_4Te_7$, or the like. A phase of the variable resistance layer 24 may be changed by a program operation. The variable resistance layer 24 may have a low-resistance crystalline state by a set operation. The variable resistance layer 24 may have a high-resistance amorphous state by a reset operation. Thus, the memory cell MC may store data using a resistance difference based on the phase of the variable resistance layer 24.

The variable resistance layer 24 may include a variable resistance material changing a resistance thereof without changing a phase and may include a chalcogenide-based material. The variable resistance layer 24 may include germanium (Ge), antimony (Sb), tellurium (Te), arsenic (As), selenium (Se), silicon (Si), indium (In), tin (Sn), sulfur (S), gallium (Ga), or a combination thereof. The variable resistance layer 24 may have a single state and maintain a phase thereof during a program operation. For example, the variable resistance layer 24 may have an amorphous state and may not change to the crystal state during a program operation. Thus, a threshold voltage of the memory cell MC may change based on a program pulse applied to the memory cell MC and the memory cell MC may be programmed into at least two program states. The variable resistance layer 24 may have a high-resistance amorphous state by a reset operation and the memory cell MC may be programmed into a reset state having a high threshold voltage. The variable resistance layer 24 may have a low-resistance amorphous state by a set operation and the memory cell MC may be programmed into a set state having the low threshold voltage.

The electrode layers 25 may be interposed between the variable resistance layers 24 and the conductive layers 26. Each of the electrode layers 25 may extend between the conductive layers 26 and the insulating layers 22. Each of the electrode layers 25 may have a C-shaped cross-section.

The electrode layers 25 may include tungsten (W), tungsten nitride (WNx), tungsten silicide (WSix), titanium (Ti), titanium nitride (TiNx), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), silicon carbide (SiC), silicon carbon nitride (SiCN), copper (Cu), zinc (Zn), nickel (Ni), cobalt (Co), lead (Pd), platinum (Pt), or a combination thereof. For example, the electrode layers 25 may be carbon electrodes.

According to the above-described structure, memory cells MC1 and MC2 may be located at intersections between the conductive pillars 23 and the conductive layers 26. Each of the memory cells MC1 and MC2 may include the electrode layer 25, the variable resistance layer 24, and the low-resistance area 21A. The low-resistance area 21A may function as an electrode layer.

The first memory cells MC1 may be located between the first protrusions P1 and the second memory cells MC2 may be located between the second protrusions P2. For example, each of the first memory cells MC1 may be located between a pair of the first protrusions P1 adjacent in the third direction III, and each of the second memory cells MC2 may be located between a pair of the second protrusions P2 adjacent in the third direction III. The first memory cells MC1 may be arranged in the first direction I and the first memory cells MC1 located at the same level may share the conductive layer 26. The second memory cells MC2 may be arranged in the first direction I and the second memory cells MC2 located at the same level may share the conductive layer 26. In addition, the first memory cell MC1 and the second memory cell MC2 which are adjacent to each other in the second direction II may be coupled to different conductive layers 26, respectively, and may share the conductive pillar 23.

The variable resistance layers 24 may include a variable resistance such as a chalcogenide and maintain an amorphous state regardless of a program state. Data may be stored in the memory cells MC1 and MC2 by a set operation in which a high-resistance amorphous state changes to a low-resistance amorphous state, or a reset operation in which a low-resistance amorphous state changes to a high-resistance amorphous state. The memory cells MC1 and MC2 each may be programmed into a high-resistance amorphous state or a low-resistance amorphous state.

For reference, each of the memory cells MC1 and MC2 may further include a select device. A select device may be turned on or off depending on an amplitude of a voltage or current being applied. Examples of the select device may include a Metal Insulator Transition (MIT) device, a Mixed Ion-Electron Conducting (MIEC), or an Ovonic Threshold Switching (OTS).

FIGS. 4A to 8A and FIGS. 4B to 8B are views illustrating a method of manufacturing an electronic device according to an embodiment of the present disclosure. FIGS. 4A to 8A are plan views and FIGS. 4B to 8B are cross-sectional views taken along line A-A' of FIGS. 4A to 8A, respectively. In the following description, description of certain elements that are discussed above may be omitted for the sake of brevity.

Figure 4A:
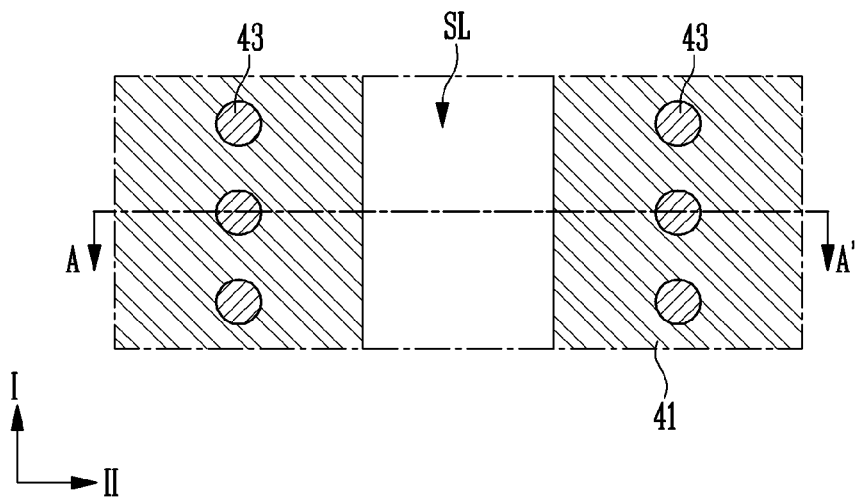
Figure 4B:
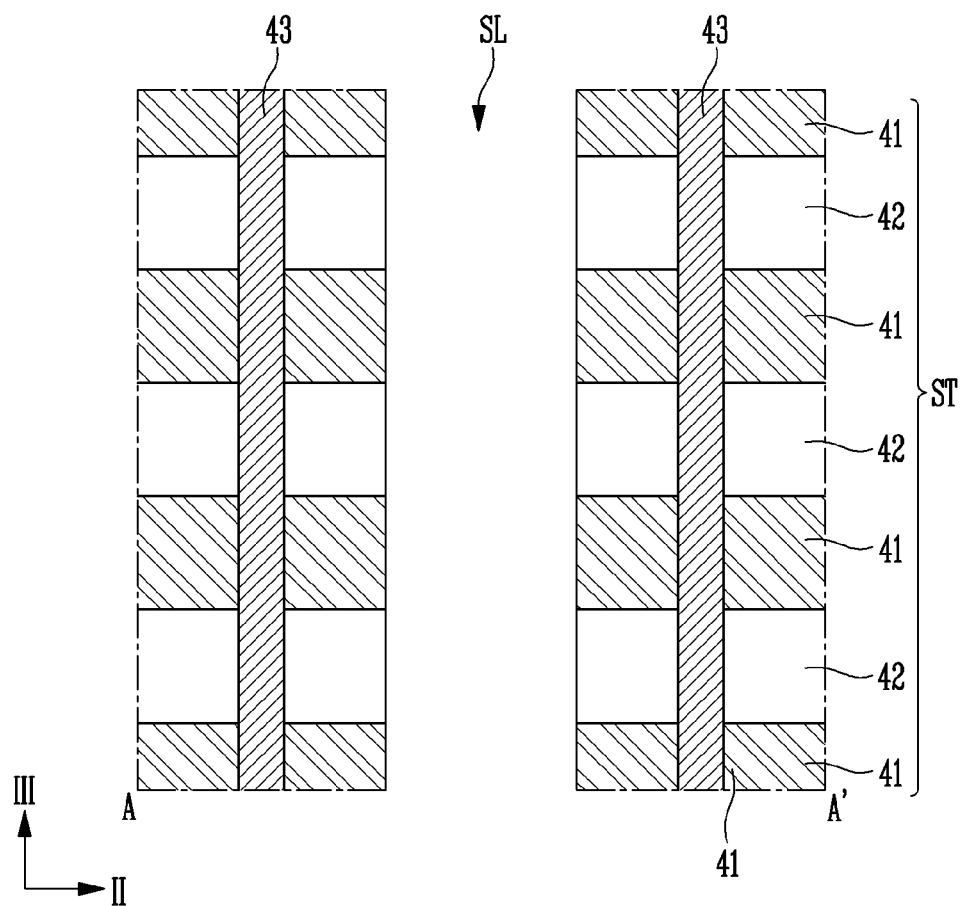

Referring to FIGS. 4A and 4B, sacrificial layers 41 and insulating layers 42 may be alternately stacked to form a stacked structure ST. By alternately depositing the sacrificial layers 41 and the insulating layers 42 on a base (not illustrated), the stacked structure ST may be formed. The base may be a semiconductor substrate and include a lower structure such as a switch, a word line, and a bit line.

The sacrificial layers 41 may be provided to an area for securing electrodes and row lines during subsequent processes. The sacrificial layers 41 may include a material having a high etch selectivity with respect to the insulating layers 42. In addition, the sacrificial layers 41 may include a field-induced resistive switching material. The sacrificial layers 41 may include a material which has insulation characteristics during initial deposition and resistance decreasing upon application of a strong field. The sacrificial layers 41 may include amorphous carbon, a silicon nitride, a transition metal oxide, or a combination thereof. For example, the amorphous carbon may be nitrogen-doped carbon. The insulating layers 42 may include an oxide layer or a nitride layer.

Conductive pillars 43 may be formed through the stacked structure ST. The conductive pillars 43 may be arranged in the first direction I and the second direction II. In addition, the conductive pillars 43 may pass through the stacked structure ST in the third direction III. The conductive pillars 43 may be vertical bit lines.

A slit SL may be formed through the stacked structure ST. The slit SL may be located between the conductive pillars 43 which are adjacent to each other in the second direction II and extend in the first direction I.

Figure 5A:
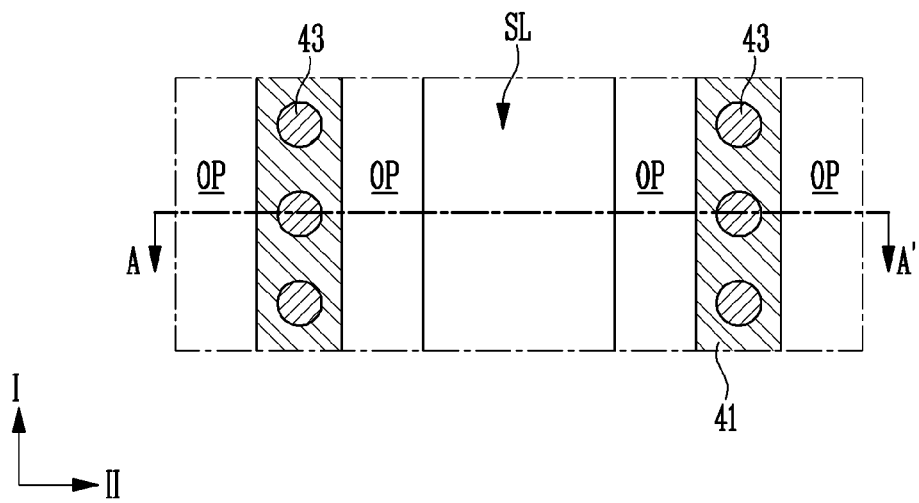
Figure 5B:
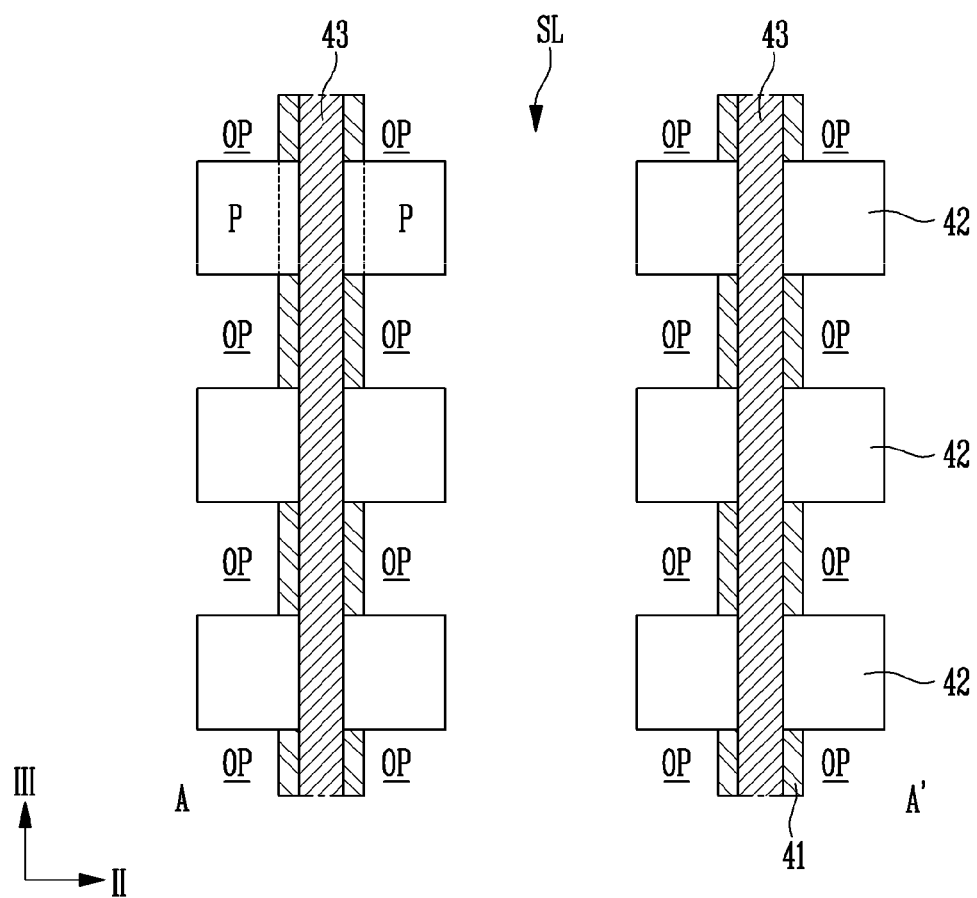

Referring to FIGS. 5A and 5B, the sacrificial layers 41 may be partially removed through the slit SL to form openings OP. Each of the sacrificial layers 41 may be etched to a predetermined depth from the slit SL. In addition, the sacrificial layers 41 may be selectively etched. Therefore, the each of the insulating layers 42 may include one or more protrusions P, each of the protrusions extending more than each of the sacrificial layers 41. In addition, the openings OP each may be formed between adjacent protrusions in the third direction III.

Figure 6A:
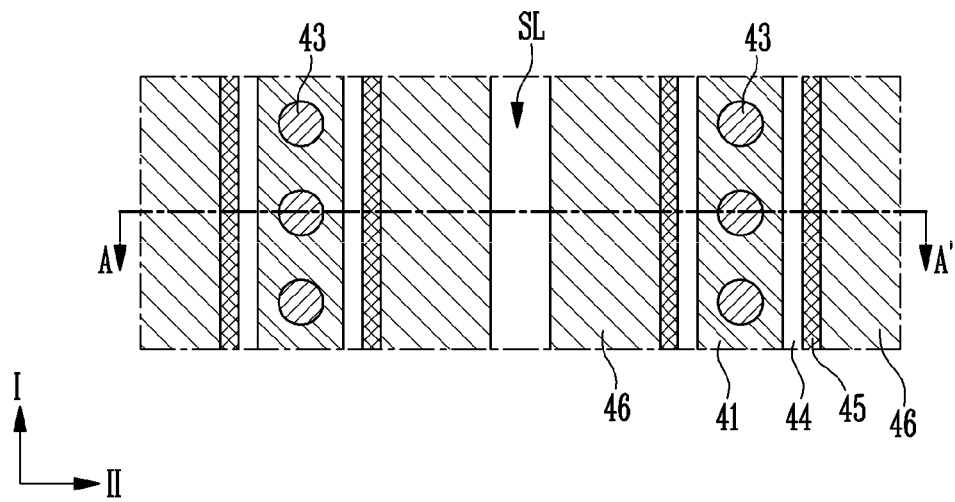
Figure 6B:
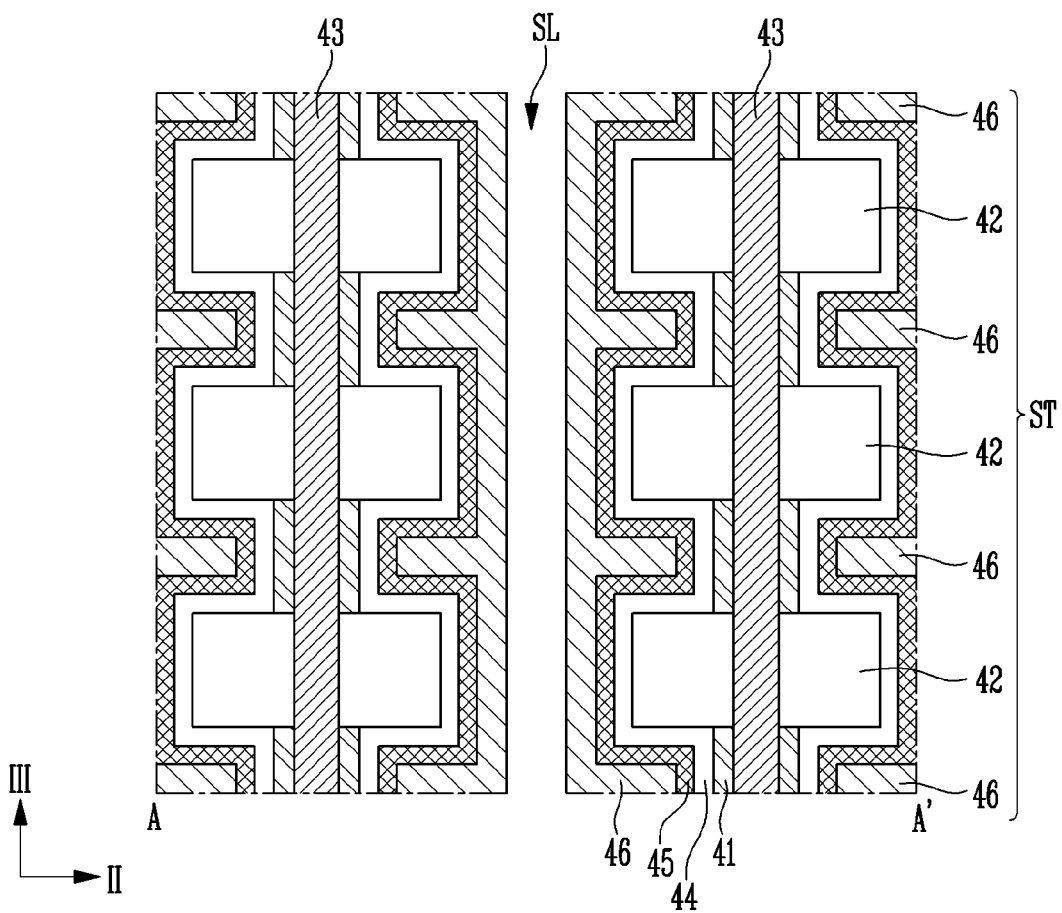

Referring to FIGS. 6A and 6B, a variable resistance material 44 may be formed in the slit SL and the openings OP. The variable resistance material 44 may be formed along inner surfaces of the slit SL and the openings OP. An electrode material 45 may be formed thereon. The electrode material 45 may be formed on the variable resistance material 44 and be formed along a profile of the variable resistance material 44. Each of the variable resistance material 44 and the electrode material 45 may have a thickness which does not fill the slit SL and the openings OP. The electrode material 45 may include carbon.

A conductive material 46 may then be formed. The conductive material 46 may be formed in the slit SL and the openings OP. The conductive material 46 may have a thickness which fills the openings OP and does not fill the slit SL. The conductive material 46 may include polysilicon, or metal such as tungsten.

Figure 7A:
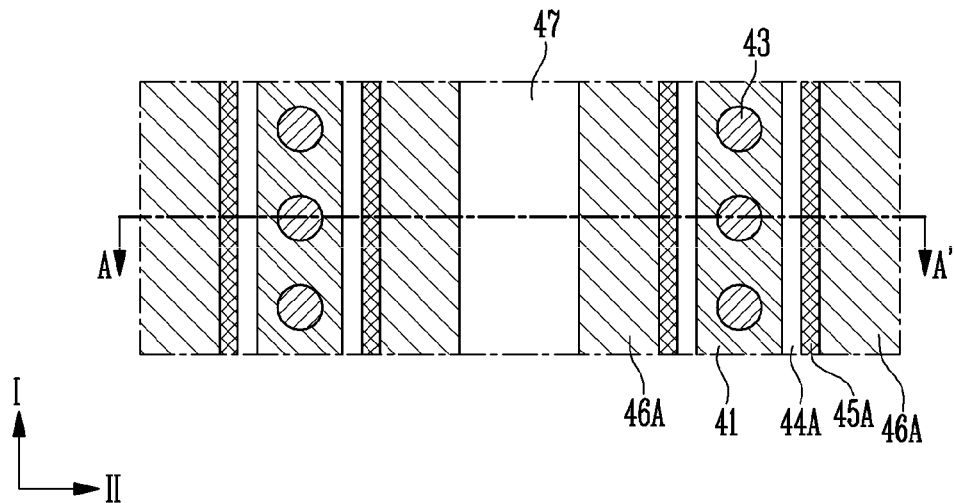
Figure 7B:
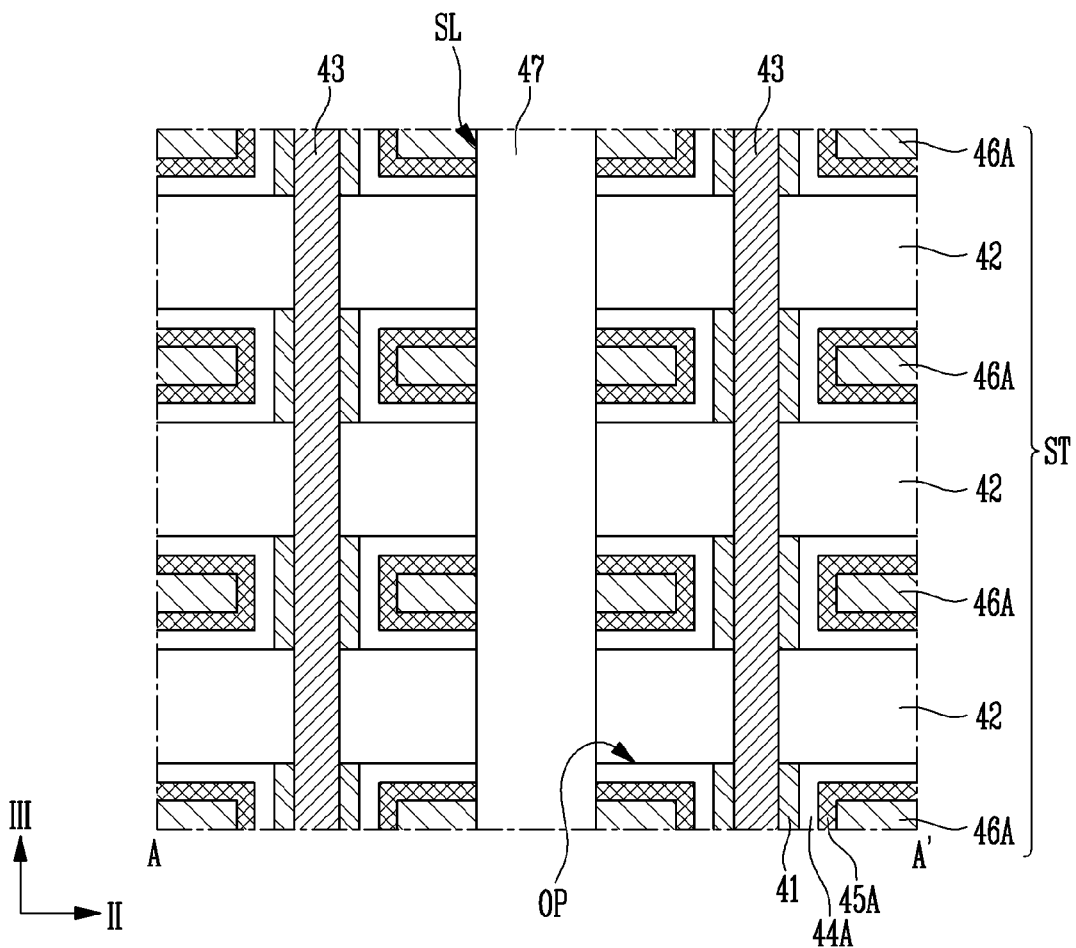

Referring to FIGS. 7A and 7B, the conductive material 46, the electrode material 45, and the variable resistance material 44 in the slit SL may be etched. As a result, conductive layers 46A, electrode layers 45A, and variable resistance layers 44A may be formed in the openings OP, respectively. The conductive layers 46A may be word lines, for example, odd word lines or even word lines. An insulating layer 47 may be formed in the slit SL. The insulating layer 47 may be a slit insulating layer.

Figure 8A:
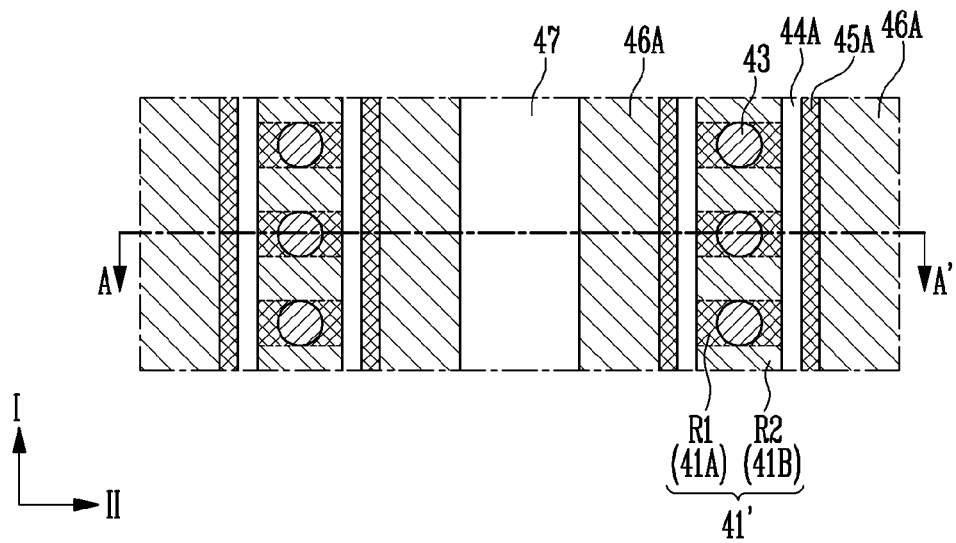
Figure 8B:
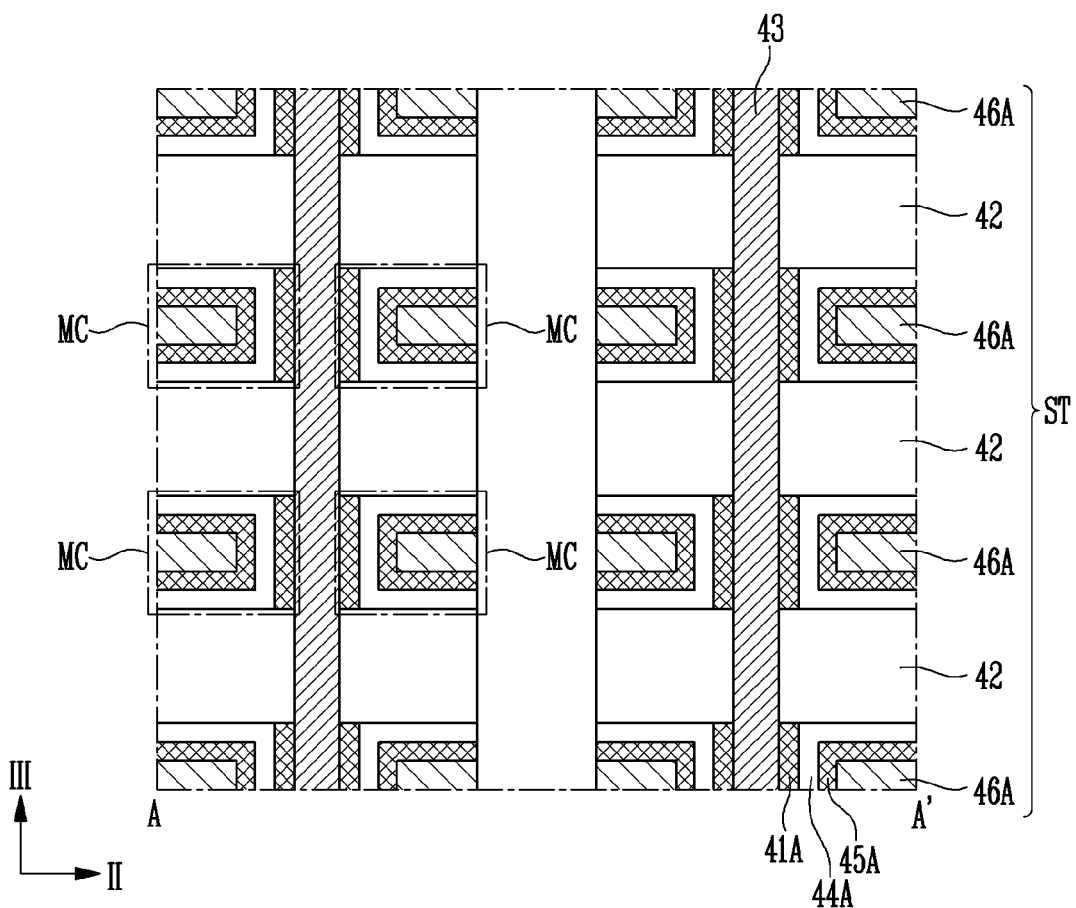

Referring to FIGS. 8A and 8B, low-resistance areas 41A may be formed in the sacrificial layer 41 to form a material layer 41'. By applying a strong electrical field locally in the sacrificial layers 41, the low-resistance areas 41A may be formed.

The sacrificial layers 41 may include first areas R1 and second areas R2. The first areas R1 may be adjacent to the conductive pillars 43 and the second areas R2 may be located between the first areas R1. By applying a strong electric field to the first areas R1 to reduce resistances of the first areas R1, the low-resistance areas 41A may be formed, and the material layer 41' including the low-resistance areas 41A and the high-resistance areas 41B may be formed. By applying a bias to the conductive pillars 43 and the conductive layers 46A, a strong electric field may be applied to the first area R1. The bias may be greater than a threshold voltage of a memory cell having a reset state and less than 10 V. For example, when a bias is applied to the conductive pillars 43 and the conductive layer 46A, an electric field is generated in the sacrificial layers 41 such that the electric field strength in the first areas R1 of the sacrificial layers 41 may be equal to or greater than a given threshold value. As a result, the resistivity of a material in the first areas R1 of the sacrificial layer 41 may be reduced compared to that before the bias is applied, thereby forming the low-resistance areas 41A of the material layer 41'.

The second area R2 to which an electric field is not applied may maintain a resistance at the time of deposition. For example, the electric field strength in the second areas R2 of the sacrificial layers 41 may be less than a given threshold value. As a result, the resistivity of a material in the second areas R2 of the sacrificial layers 41 may be kept substantially the same as that at the time of deposition, thereby forming the high-resistance areas 41B of the material layer 41'. Therefore, the second area R2 may have a greater resistance than the first area R1 and be a high-resistance area 41B. Each of the material layers 41' may include one or more low-resistance area 41A and one or more high-resistance area 41B. For example, a plurality of low-resistance areas 41A and a plurality of high-resistance areas 41B may be arranged alternately with each other in the first direction I. The low-resistance areas 41A may be electrically conductive. Since the high-resistance areas 41B maintains insulating properties, the low-resistance areas 41A which are adjacent to each other in the first direction I may be electrically insulated from each other.

According to the above-described manufacturing method, the memory cells MC1 and MC2 may be located at intersections between the conductive pillars 43 and the conductive layers 46A. Each of the memory cells MC1 and MC2 may include the electrode layer 45A, the variable resistance layer 44, and the low-resistance area 41A. The low-resistance area 41A may function as an electrode. Because the low-resistance area 41A functioning as an electrode may be formed using a relatively simple process compared to a conventional process of forming an electrode, an electronic device according to an embodiment of the present disclosure may be manufactured using a relatively simple method, thereby reducing the manufacturing cost while increasing the degree of integration of the electronic device.

Figure 9:
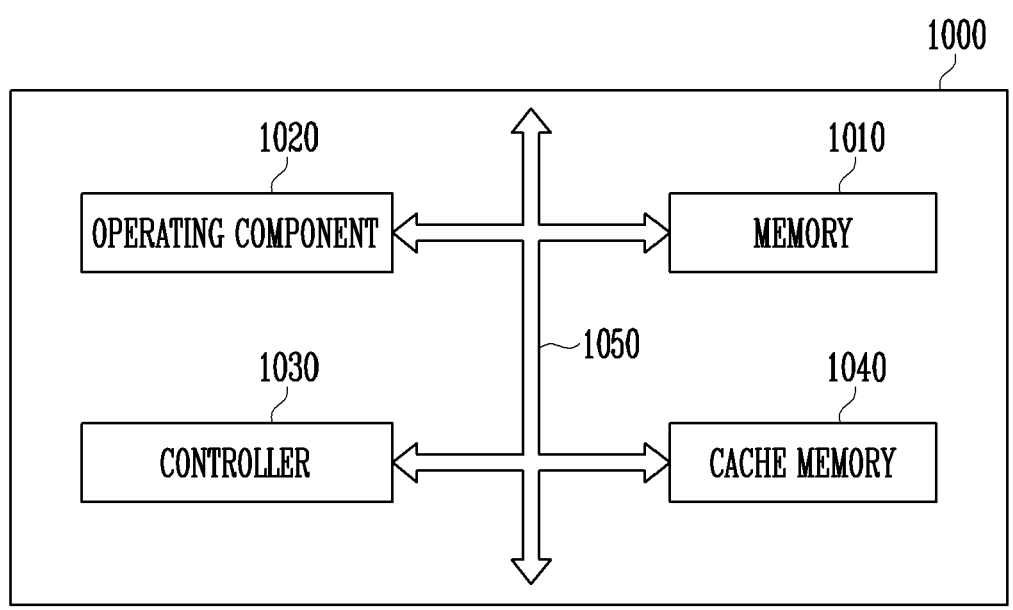
FIG. 9 is a diagram illustrating the configuration of a microprocessor employing a memory device according to an embodiment of the present disclosure.

FIG. 9 is a diagram illustrating the configuration of a microprocessor 1000 employing a memory device according to an embodiment of the present disclosure.

Referring to FIG. 9, the microprocessor 1000 may control and adjust a series of processes of receiving data from various types of external devices, processing the data, and sending results to external devices. The microprocessor 1000 may include a memory 1010, an operating component 1020, and a controller 1030. The microprocessor 1000 may be one of various types of data processing units such as a central processing unit (CPU), a graphic processing unit (GPU), a digital signal processor (DSP) and an application processor (AP).

The memory 1010 may be a processor register or a register, and may store data in the microprocessor 1000. The memory 1010 may include various types of registers including a data register, an address register, and a floating point register. The memory 1010 may temporarily store addresses at which data for performing an operation in the operating component 1020, data of a result of the performance, and data for the performance are stored.

The memory 1010 may include one or more embodiments of the electronic device described above. For example, the memory 1010 may include material layers each including one or more low-resistance areas and one or more high-resistance areas, insulating layers stacked alternately with the material layers and including protrusions extending more than the material layers, conductive pillars passing through the insulating layers and the low-resistance areas; conductive layers located between the protrusions; and variable resistance layers interposed between the low-resistance areas and the conductive layers. Therefore, read operation characteristics of the memory 1010 may be improved. As a result, read operation characteristics of the memory 1000 may be improved.

The operating component 1020 may perform various arithmetic operations or logical operations according to a result obtained by decoding an instruction by the controller 1030. The operating component 1020 may include at least one arithmetic and logic unit (ALU).

The controller 1030 may receive signals from the memory 1010, the operating component 1020 and the external devices of the microprocessor 1000, extract or decode a command, control the signal input and output of the microprocessor 1000, and execute processing represented by program.

According to the present disclosure, the microprocessor 1000 may further include a cache memory 1040 that temporarily stores data input from an external device, in addition to the memory 1010, or data to be output to the external device. The cache memory 1040 may exchange data with the memory 1010, the operating component 1020 and the controller 1030 through a bus interface 1050.

Figure 10:
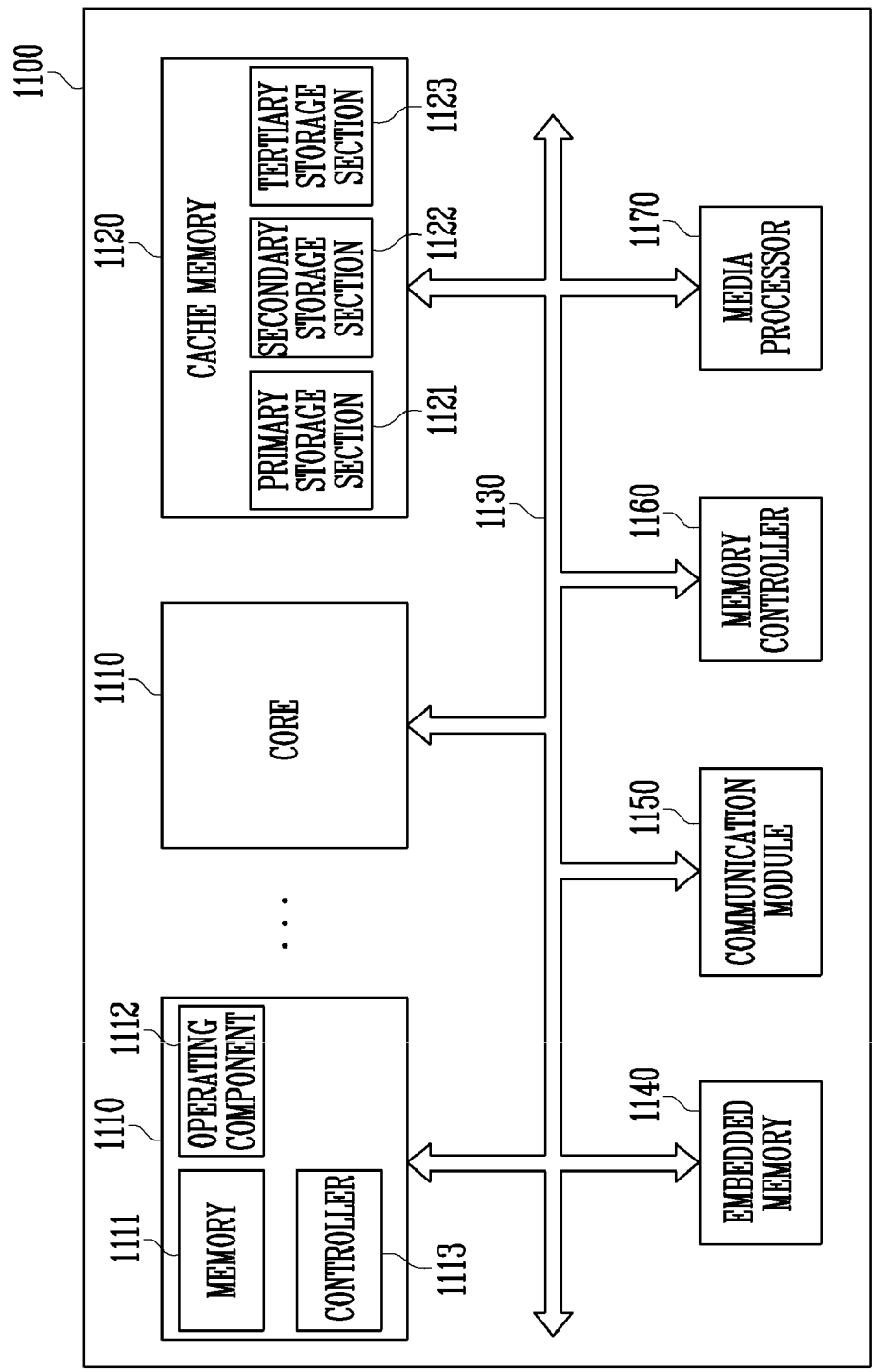
FIG. 10 is a diagram illustrating the configuration of a processor employing a memory device according to an embodiment of the present disclosure.

FIG. 10 is a diagram illustrating the configuration of the processor 1100 employing a memory device according to an embodiment of the present disclosure.

Referring to FIG. 10, the processor 1100 may improve performance and perform multiple functions in addition to the functions of a microprocessor controlling and adjusting a series of processes of receiving and processing data from various external devices and sending results thereof to the external devices. The processor 1100 may include a core unit 1110 serving as a microprocessor, a cache memory 1120 temporarily storing data, and a bus interface 1130 for data transfer between internal external devices. The processor 1100 may include various types of systems on chip (SoCs) such as a multi-core processor, a graphic processing unit (GPU), and an application processor (AP).

According to an embodiment of the present disclosure, the core unit 1110 may perform arithmetic and logic operations on the data input from the external device and may include a memory 1111, an operating component 1112 and a controller 1113.

The memory 1111 may be a processor register or a register, and may store data in the processor 1100. The memory 1111 may include various types of registers including a data register, an address register, and a floating point register. The memory 1111 may temporarily store addresses at which data for performing an operation in the operating component 1112, data of a result of the performance, and data for the performance are stored. The operating component 1112 may perform an operation in the processor 1100. More specifically, the operating component 1112 may perform various fundamental arithmetic operations or logical operations according to a result of decoding an instruction. The operating component 1112 may include at least one arithmetic and logic unit (ALU). The controller 1113 may receive signals from the memory 1111, the operating component 1112 and the external devices of the processor 1100, extract or decode a command, control the signal input and output of the processor 1100, and execute processing represented by program.

The cache memory 1120 may temporarily store data so as to compensate for the difference in data processing speed between the core unit 1110 operating at a high speed and the external device operating at a low speed. The cache memory 1120 may include a primary storage section 1121, a secondary storage section 1122 and a tertiary storage section 1123. In general, the cache memory 1120 may include the primary and secondary storage sections 1121 and 1122. However, when high capacity is required, the cache memory 1120 may further include the tertiary storage section 1123. If necessary, the cache memory 1120 may include more storage sections. In other words, the number of storage sections included in the cache memory 1120 may vary depending on the design. The primary, secondary and tertiary storage sections 1121, 1122 and 1123 may have the same or different processing speeds for storing and determining data. When the respective storage sections have different processing speeds, the primary storage section 1121 may have the highest processing speed among the primary, secondary, and tertiary storage sections 1121, 1122, and 1123. At least one of the primary, secondary and tertiary storage sections 1121, 1122 and 1123 may include at least one of the embodiments of the above-described semiconductor device. For example, the cache memory 1120 may include material layers each including one or more low-resistance areas and one or more high-resistance areas, insulating layers stacked alternately with the material layers and including protrusions extending more than the material layers, conductive pillars passing through the insulating layers and the low-resistance areas; conductive layers located between the protrusions; and variable resistance layers interposed between the low-resistance areas and the conductive layers. Therefore, read operation characteristics of the cache memory 1120 may be improved. As a result, read operation characteristics of the processor 1100 may be improved.

As illustrated in FIG. 10, all of the primary, secondary and tertiary storage sections 1121, 1122 and 1123 may be included in the cache memory 1120. However, the primary, secondary and tertiary storage sections 1121, 1122 and 1123 of the cache memory 1120 may be provided outside the core unit 1110 to compensate for the difference in processing speeds of the core unit 1110 and the external device. Alternatively, the primary storage section 1121 of the cache memory 1120 may be located in the core unit 1110, and the secondary storage section 1122 and the tertiary storage section 1123 may be provided outside the core unit 1110 to enhance the function of supplementing the difference in data processing speed. In another example, the primary and secondary storage sections 1121 and 1122 may be located in the core unit 1110 and the tertiary storage section 1123 may be located outside the core unit 1110.

The bus interface 1130 may connect the core unit 1110, the cache memory 1120 and the external device so that data may be efficiently transferred between.

According to an embodiment of the present disclosure, the processor 1100 may include a plurality of core units 1110 which may share the cache memory 1120. The plurality of core units 1110 and the cache memory 1120 may be directly coupled to each other, or may be coupled through the bus interface 1130. Each of the plurality of core units 1110 may have the same configuration as the above-described core unit. When the processor 1100 includes the plurality of core units 1110, the number of primary storage sections 1121 of the cache memory 1120 may correspond to the number of core units 1110. Each of the primary storage sections 1121 may be included in each of the core units 1110. In addition, the secondary storage section 1122 and the tertiary storage section 1123 may be provided outside the plurality of core units 1110 and shared by the plurality of core units 1110 through the bus interface 1130. The primary storage section 1121 may have a faster processing speed than the secondary and tertiary storage sections 1122 and 1123. In another embodiment, the number of primary storage sections 1121 and the number of secondary storage sections 1122 may correspond to the number of core units 1110. Each of the primary storage sections 1121 and each of the secondary storage sections 1122 may be included in each of the core units 1110. The tertiary storage section 1123 may be provided outside the plurality of core units 1110 and shared by the plurality of core units 1110 through the bus interface 1130.

According to an embodiment of the present disclosure, the processor 1100 may include an embedded memory 1140 storing data, a communication module 1150 wiredly or wirelessly transmitting or receiving the data to or from an external device, a memory controller 1160 driving an external memory device, and a media processor 1170 processing or outputting data, processed by the processor 1100 or input from the external input device, to an external interface device. The processor 1100 may further include various other modules and devices. The added modules may exchange data with each other and with the core unit 1110 and the cache memory 1120 through the bus interface 1130.

The embedded memory 1140 may include a non-volatile memory as well as a volatile memory. A volatile memory may include a dynamic random access memory (DRAM), a Mobile DRAM, a Static Random Access Memory (SRAM), and the like. A non-volatile memory may include a Read Only Memory (ROM), a NOR Flash Memory, a NAND Flash Memory, a Phase Change Random Access Memory (PRAM), a Resistive Random Access Memory (RRAM), a Spin Transfer Torque Random Access Memory (STTRAM), a Magnetic Random Access Memory (MRAM), and the like.

The communication module 1150 may include a module connected to a wired network, a module connected to a wireless network, or both. A wired network module may include a Local Area Network (LAN), a Universal Serial Bus (USB), an Ethernet, Power Line Communication (PLC), or the like, which transmits and receives data through a transmission line. A wireless network module may include Infrared Data Association (IrDA), Code Division Multiple Access (CDMA), Time Division Multiple Access (TDMA), Frequency Division Multiple Access (FDMA), a Wireless LAN, Zigbee, a Ubiquitous Sensor Network (USN), Bluetooth, Radio Frequency IDentification (RFID), Long Term Evolution (LTE), Near Field Communication (NFC), Wireless Broadband Internet (Wibro), High Speed Downlink Packet Access (HSDPA), Wideband CDMA (WCDMA), Ultra WideBand (UWB), or the like, which transmits and receives data without a transmission line.

The memory controller 1160 may include various controllers for processing and managing data transferred between the processor 1100 and an external storage device which operates according to a different communication standard from that of the processor 1100. For example, the memory controller 1160 may include a controller controlling Integrated Device Electronics (IDE), Serial Advanced Technology Attachment (SATA), a Small Computer System Interface (SCSI), a Redundant Array of Independent Disks (RAID), a solid state disk (SSD), External SATA (eSATA), Personal Computer Memory Card International Association (PCMCIA), a USB, a secure digital (SD) card, a mini secure digital (mSD) card, a micro SD card, a secure digital high capacity (SDHC) card, a memory stick card, a smart media card (SM), a multimedia card (MMC), an embedded MMC (eMMC), a compact flash (CF) card, or the like.

The media processor 1170 may process data processed by the processor 1100, or data in the form of video or audio or in another form, which is input from an external input device, and may output the processed data to an external interface device. The media processor 1170 may include a Graphics Processing Unit (GPU), a Digital Signal Processor (DSP), a High Definition Audio (HD audio), a high definition multimedia interface (HDMI) controller, or the like.

Figure 11:
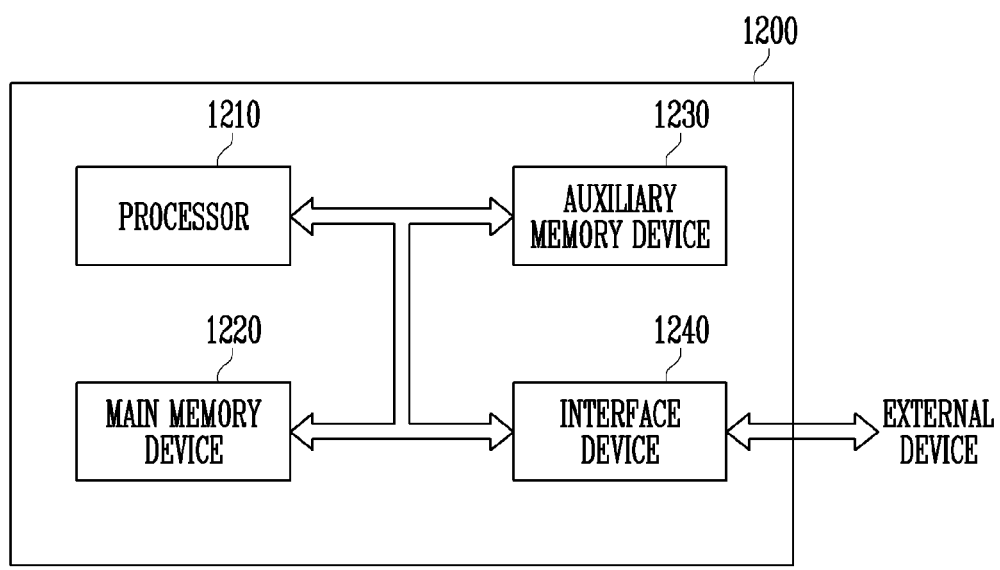
FIG. 11 is a diagram illustrating the configuration of a system employing a memory device according to an embodiment of the present disclosure.

FIG. 11 is a diagram illustrating the configuration of a system 1200 employing a memory device according to an embodiment of the present disclosure.

Referring to FIG. 11, the system 1200 may refer to a device configured to process data. To perform a series of manipulations for data, the system 1200 may perform inputting, processing, outputting, communicating, storing, and the like to perform a series of operations on data. The system 1200 may include a processor 1210, a main memory device 1220, an auxiliary memory device 1230, and an interface device 1240. According to an embodiment of the present disclosure, the system 1200 may be a computer, a server, a personal digital assistant (PDA), a portable computer, a web tablet, a wireless phone, a mobile phone, a smart phone, a digital music player, a portable multimedia player (PMP), a camera, a global positioning system (GPS), a video camera, a voice recorder, Telematics, an audio visual (AV) system, or a smart television.

The processor 1210 may control the decoding of input commands and the processing of the data stored in the system 1200, such as operation and comparison of the data. The processor 1210 may include one or more of a microprocessor unit (MPU), a central processing unit (CPU), a single/multi-core processor, a graphic processing unit (GPU), an application processor (AP), a digital signal processor (DSP), and so on.

The main memory device 1220 may refer to a storage that stores program codes and/or data from the auxiliary memory device 1230 and performs execution when program is executed. The stored program codes and data may be retained even in the absence of power supply. The main memory device 1220 may include one or more embodiments of the electronic device described above. For example, the main memory device 1220 may include material layers each including one or more low-resistance areas and one or more high-resistance areas, insulating layers stacked alternately with the material layers and including protrusions extending more than the material layers, conductive pillars passing through the insulating layers and the low-resistance areas; conductive layers located between the protrusions; and variable resistance layers interposed between the low-resistance areas and the conductive layers. Therefore, read operation characteristics of the main memory device 1220 may be improved. As a result, read operation characteristics of the system 1200 may be improved.

In addition, the main memory device 1220 may further include a volatile static random access memory (SRAM) or a volatile dynamic random access memory (DRAM) which loses all data when power supply is blocked. In another example, the main memory device 1220 may not include the electronic device according to the above-described embodiment and may include a volatile memory, such as a static random access memory (SRAM) or a dynamic random access memory (DRAM) which loses all data stored therein when power supply is off.

The auxiliary memory device 1230 may refer to a memory device designed to store program codes or data. Although the auxiliary memory device 1230 is slower than the main memory device 1220, the auxiliary memory device 1230 may store more data than the main memory device 1220. The auxiliary memory device 1230 may include one or more of the above-described embodiments of the electronic device. For example, the auxiliary memory device 1230 may include material layers each including one or more low-resistance areas and one or more high-resistance areas, insulating layers stacked alternately with the material layers and including protrusions extending more than the material layers, conductive pillars passing through the insulating layers and the low-resistance areas; conductive layers located between the protrusions; and variable resistance layers interposed between the low-resistance areas and the conductive layers. Therefore, read operation characteristics of the main memory device 1220 may be improved. As a result, read operation characteristics of the system 1200 may be improved.

Figure 12:
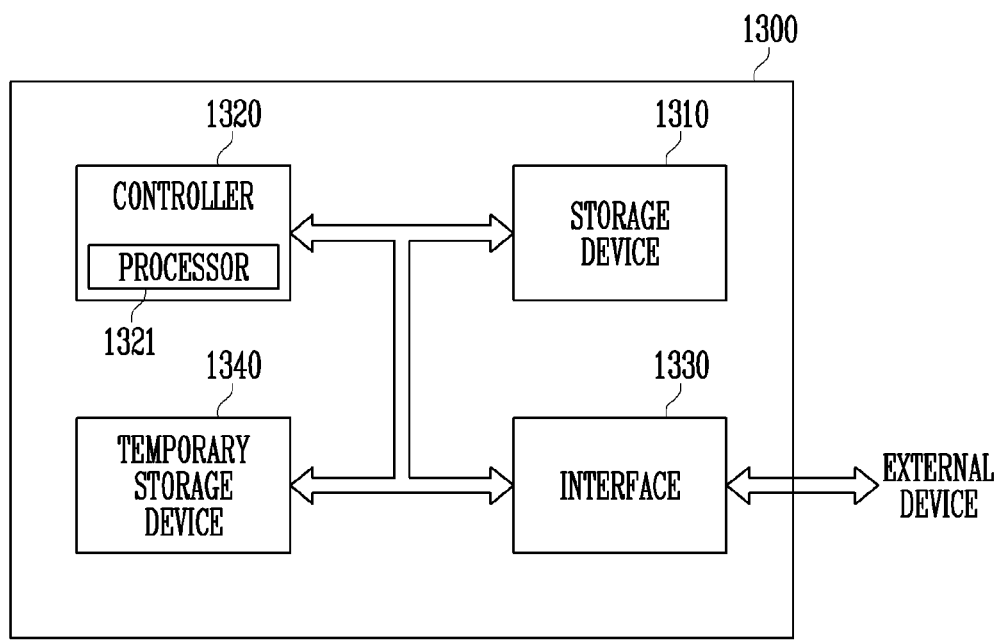
FIG. 12 is a diagram illustrating the configuration of a data storage system employing a memory device according to an embodiment of the present disclosure.

In addition, the auxiliary memory device 1230 may further include a data storage system 1300 as shown in FIG. 12, such as a magnetic tape using magnetism, a magnetic disk, a laser disk using optics, a magneto-optical disc using both magnetism and optics, a solid state disk (SSD), a universal serial bus (USB) memory, a secure digital (SD) card, a mini secure digital (mSD) card, a micro secure digital (SD) card, a secure digital high capacity (SDHC) card, a memory stick card, a smart media (SM) card, a multimedia card (MMC), an embedded MMC (eMMC), a compact flash (CF) card, or the like. However, in contrast thereto, the auxiliary memory device 1230 may not include the memory device according to any of the embodiments and may include a data storage system such as a magnetic tape using magnetism, a magnetic disk, a laser disk using optics, a magneto-optical disc using both magnetism and optics, a solid state disk (SSD), a universal serial bus (USB) memory, a secure digital (SD) card, a mini secure digital (mSD) card, a micro secure digital (SD) card, a secure digital high capacity (SDHC) card, a memory stick card, a smart media (SM) card, a multimedia card (MMC), an embedded MMC (eMMC), a compact flash (CF) card, or the like.

The interface device 1240 may be provided to perform exchange of commands and data between the system 1200 of this embodiment and an external device. The interface device 1240 may be a keypad, a keyboard, a mouse, a speaker, a microphone, a display, various human interface devices (HIDs), a communication device, and so on. The communication device may include either or both a module connected to a wired network and a module connected to a wireless network. The wired network module may include a Local Area Network (LAN), a Universal Serial Bus (USB), an Ethernet, Power Line Communication (PLC) in the same manner as in various devices which transmit and receive data through transmission lines. The wireless network module may include Infrared Data Association (IrDA), Code Division Multiple Access (CDMA), Time Division Multiple Access (TDMA), Frequency Division Multiple Access (FDMA), a Wireless LAN, Zigbee, a Ubiquitous Sensor Network (USN), Bluetooth, Radio Frequency IDentification (RFID), Long Term Evolution (LTE), Near Field Communication (NFC), Wireless Broadband Internet (Wibro), High Speed Downlink Packet Access (HSDPA), Wideband CDMA (WCDMA), Ultra WideBand (UWB), and the like in the same manner as in various devices which transmit and receive data without a transmission line.

FIG. 12 is a diagram illustrating the configuration of the data storage system 1300 employing a memory device according to an embodiment of the present disclosure.

Referring to FIG. 12, the data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type device such as a hard disk drive (HDD), a compact disc read only memory (CDROM), a digital versatile disc (DVD), and a solid state disk (SSD), and a card type device such as a universal serial bus (USB) memory, a secure digital (SD) card, a mini secure digital (mSD) card, a micro secure digital (SD) card, a secure digital high capacity (SDHC) card, a memory stick card, a smart media (SM) card, a multimedia card (MMC), an embedded MMC (eMMC), and a compact flash (CF) card.

The storage device 1310 may include a non-volatile memory which stores data semi-permanently. The non-volatile memory may include a read only memory (ROM), a NOR flash memory, a NAND flash memory, a phase change random access memory (PRAM), a resistive random access memory (RRAM), and a magnetic random access memory (MRAM).

The controller 1320 may control data exchange between the storage device 1310 and the interface 1330. The controller 1320 may include a processor 1321 for performing an operation for processing commands input through the interface 1330 from an external device of the data storage system 1300.

The interface 1330 may be provided to exchange commands and data between external devices. In the case where the data storage system 1300 is a card type device, the interface 1330 may be compatible with interfaces which are used in devices, such as a universal serial bus (USB) memory, a secure digital (SD) card, a mini secure digital (mSD) card, a micro secure digital (SD) card, a secure digital high capacity (SDHC) card, a memory stick card, a smart media (SM) card, a multimedia card (MMC), an embedded MMC (eMMC), and a compact flash (CF) card, or may be compatible with interfaces which are used in devices similar to the above-mentioned devices. In the case where the data storage system 1300 is a disk type device, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal, serial bus), and the like. The interface 1330 may be compatible with interfaces which are similar to these interfaces. The interface 1330 may be compatible with one or more interfaces having different types.

The temporary storage device 1340 may store data temporarily for efficiently transferring data between the interface 1330 and the storage device 1310 according to diversifications and high performance of an interface with an external device, a controller and a system. The temporary storage device 1340 may include one or more of the above-described embodiments of the electronic device. For example, the temporary storage device 1340 may include material layers each including one or more low-resistance areas and one or more high-resistance areas, insulating layers stacked alternately with the material layers and including protrusions extending more than the material layers, conductive pillars passing through the insulating layers and the low-resistance areas; conductive layers located between the protrusions; and variable resistance layers interposed between the low-resistance areas and the conductive layers. Therefore, read operation characteristics of the temporary storage device 1340 may be improved. As a result, read operation characteristics of the data storage system 1300 may be improved.

Figure 13:
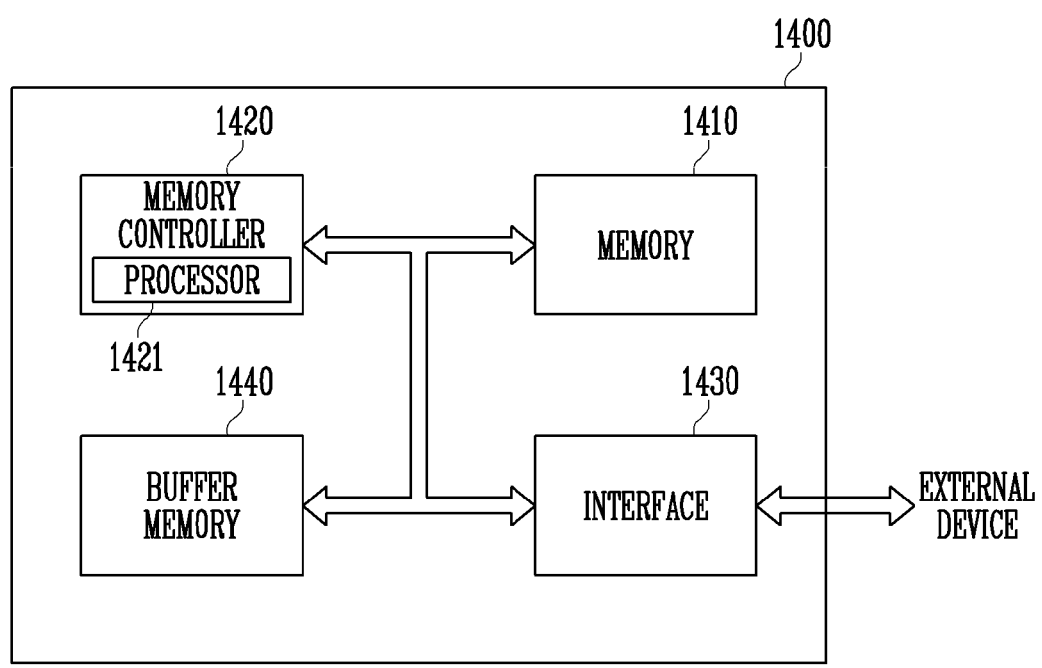
FIG. 13 is a diagram illustrating the configuration of a memory system employing a memory device according to an embodiment of the present disclosure.

FIG. 13 is a diagram illustrating the configuration of a memory system 1400 employing a memory device according to an embodiment of the present disclosure.

Referring to FIG. 13, the memory system 1400 may include a memory 1410 which has a nonvolatile characteristic as a component for storing data, a memory controller 1420 which controls the memory 1410, and an interface 1430 for connection with an external device. The memory system 1400 may be a card type device such as a solid state disk (SSD), a universal serial bus (USB) memory, a secure digital (SD) card, a mini secure digital (mSD) card, a micro secure digital (SD) card, a secure digital high capacity (SDHC) card, a memory stick card, a smart media (SM) card, a multimedia card (MMC), an embedded MMC (eMMC), a compact flash (CF) card, or the like.

The memory 1410 storing data may include at least one of the above-described embodiments of the electronic device. For example, the memory 1410 may include material layers each including one or more low-resistance areas and one or more high-resistance areas, insulating layers stacked alternately with the material layers and including protrusions extending more than the material layers, conductive pillars passing through the insulating layers and the low-resistance areas; conductive layers located between the protrusions; and variable resistance layers interposed between the low-resistance areas and the conductive layers. Thus, read operation characteristics of the memory 1410 may be improved. As a result, read operation characteristics of the memory system 1400 may be improved.

The memory according to this embodiment may include a read only memory (ROM), a NOR flash memory, a NAND flash memory, a phase change random access memory (PRAM), a resistive random access memory (RRAM), and a magnetic random access memory (MRAM).

The memory controller 1420 may control data exchange between the memory 1410 and the interface 1430. The memory controller 1420 may include a processor 1421 for performing an operation for processing commands input through the interface 1430 from an external device of the data system 1400.

The interface 1430 may be provided to exchange commands and data between the memory system 1400 and the external device. The interface 1430 may be compatible with interfaces which are used in devices, such as a universal serial bus (USB) memory, a secure digital (SD) card, a mini secure digital (mSD) card, a micro secure digital (SD) card, a secure digital high capacity (SDHC) card, a memory stick card, a smart media (SM) card, a multimedia card (MMC), an embedded MMC (eMMC), and a compact flash (CF) card, or may be compatible with interfaces which are used in devices similar to the above-mentioned devices. The interface 1430 may be compatible with one or more interfaces having different types.

According to this embodiment, the memory system 1400 may further include a buffer memory 1440 for efficient transfer of data input and output between the interface 1430 and the memory 1410 according to diversification and high performance of an interface with an external device, a memory controller and a memory system. The buffer memory 1440 storing data may include at least one of the above-described embodiments of the electronic device. For example, the buffer memory 1440 may include material layers each including one or more low-resistance areas and one or more high-resistance areas, insulating layers stacked alternately with the material layers and including protrusions extending more than the material layers, conductive pillars passing through the insulating layers and the low-resistance areas; conductive layers located between the protrusions; and variable resistance layers interposed between the low-resistance areas and the conductive layers. As a result, read operation characteristics of the memory system 1400 may be improved.

In addition, according to this embodiment, the buffer memory 1440 may further include a static random access memory (SRAM) or a dynamic random access memory (DRAM), which has a volatile characteristic, and a Read Only Memory(ROM), a NOR Flash Memory, a NAND Flash Memory, a phase change random access memory (PRAM), a resistive random access memory (RRAM), a spin transfer torque random access memory (STTRAM), or a magnetic random access memory (MRAM), which has a nonvolatile characteristic. In another embodiment, the buffer memory 1440 may not include the memory device according to any of the embodiments described above, and may include a static random access memory (SRAM) or a dynamic random access memory (DRAM), which has a volatile characteristic, and a Read Only Memory (ROM), a NOR Flash Memory, a NAND Flash Memory, a phase change random access memory (PRAM), a resistive random access memory (RRAM), a spin transfer torque random access memory (STTRAM), or a magnetic random access memory (MRAM), which has a non-volatile characteristic.

Operating characteristics and reliability of memory cells may be improved.

While embodiments of the present disclosure have been disclosed for illustrative purposes, those skilled in the art will appreciate that various modifications, additions and substitutions are possible. Thus, it is intended that the present invention cover all such modifications provided they come within the scope of the appended claims and their equivalents.

What is claimed is:

1. A method of manufacturing an electronic device including a semiconductor memory, the method comprising:
   forming a stacked structure including sacrificial layers and insulating layers stacked alternately with each other;
   forming conductive pillars passing through the stacked structure;
   forming a slit passing through the stacked structure;
   forming openings by partially removing the sacrificial layers through the slit;
   forming variable resistance layers in the openings;
   forming conductive layers in the openings; and
   forming material layers including conductive areas and insulating areas by applying an electric field to portions of the sacrificial layers.

2. The method of claim 1, further comprising forming electrode layers on the variable resistance layers.

3. The method of claim 2, wherein the electrode layers includes carbon.

4. The method of claim 1, wherein the sacrificial layers include first areas and second areas, the first areas being adjacent to the conductive pillars, each of the second areas being disposed between an adjacent pair of the first areas, and
   wherein the electric field is applied to the first areas adjacent to the conductive pillars.

5. The method of claim 4, wherein a resistance of the first areas is reduced by the electric field and the first areas are electrically insulated from each other by the second areas.

6. The method of claim 1, wherein the sacrificial layers include a field-induced resistive switching material.

7. The method of claim 1, wherein the sacrificial layers include an amorphous carbon layer, a silicon nitride layer, a transition metal oxide layer, or a combination thereof.

8. The method of claim 1, wherein memory cells are located at intersections between the conductive pillars and the conductive layers, and are programmed into a first amorphous state or a second amorphous state.

9. The method of claim 1, wherein the variable resistance layers maintain an amorphous state in a set operation.

* * * * *